United States Patent
Harris et al.

(10) Patent No.: US 6,710,436 B1
(45) Date of Patent: Mar. 23, 2004

(54) METHOD AND APPARATUS FOR ELECTROSTATICALLY ALIGNING INTEGRATED CIRCUITS

(75) Inventors: David L. Harris, Claremont, CA (US); Robert J. Drost, Mountain View, CA (US); Ivan E. Sutherland, Santa Monica, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/317,481

(22) Filed: Dec. 12, 2002

(51) Int. Cl.⁷ ............................................. B65G 49/07

(52) U.S. Cl. ....................... 257/686; 257/723; 257/726; 414/788; 414/217

(58) Field of Search ................................ 257/666–734; 414/217, 788, 735, 749; 29/830–855

(56) References Cited

U.S. PATENT DOCUMENTS

2003/0189201 A1 * 10/2003 Chen ........................... 257/13

* cited by examiner

*Primary Examiner*—H. Jey Tsai
(74) *Attorney, Agent, or Firm*—Park, Vaughan & Fleming LLP

(57) ABSTRACT

One embodiment of the present invention provides a system that uses electrostatic forces to align semiconductor chips relative to each other. The system operates by fabricating a first set of conductors on the top surface of a first chip and fabricating a corresponding second set of conductors on the top surface of a second chip. To align the chips, the system electrically charges the first set of conductors and the second set of conductors. The system also places the first chip face-to-face with the second chip, so that the first set of conductors is in close proximity to the second set of conductors. This allows electrostatic forces between the first set of conductors and the second set of conductors to bring the first chip into alignment with the second chip and to hold them in place.

17 Claims, 5 Drawing Sheets

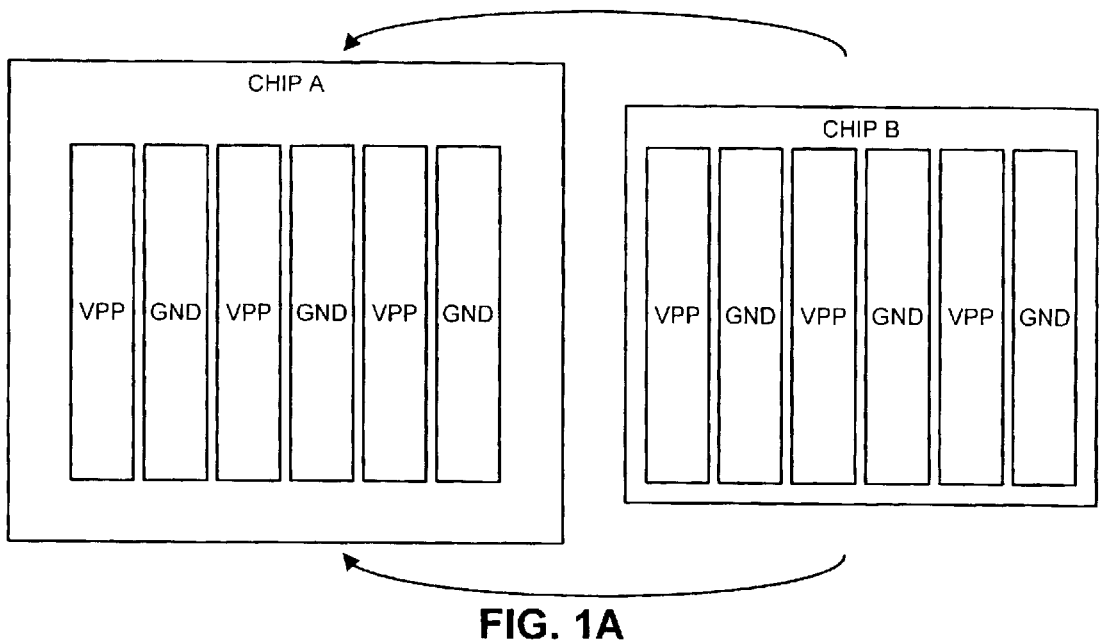
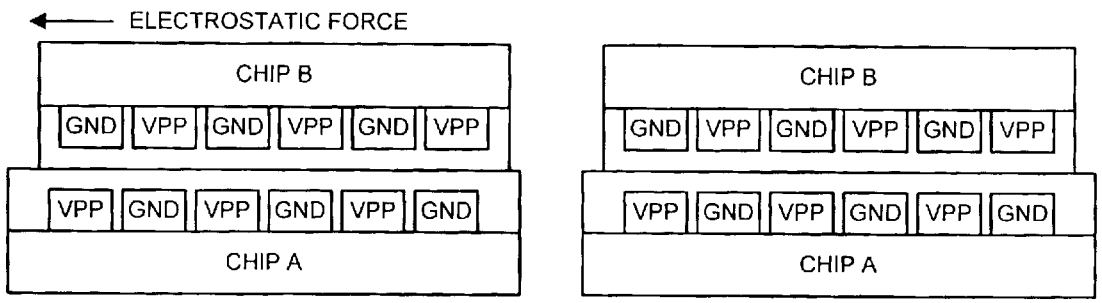
FIG. 1A
FIG. 1B
FIG. 1C
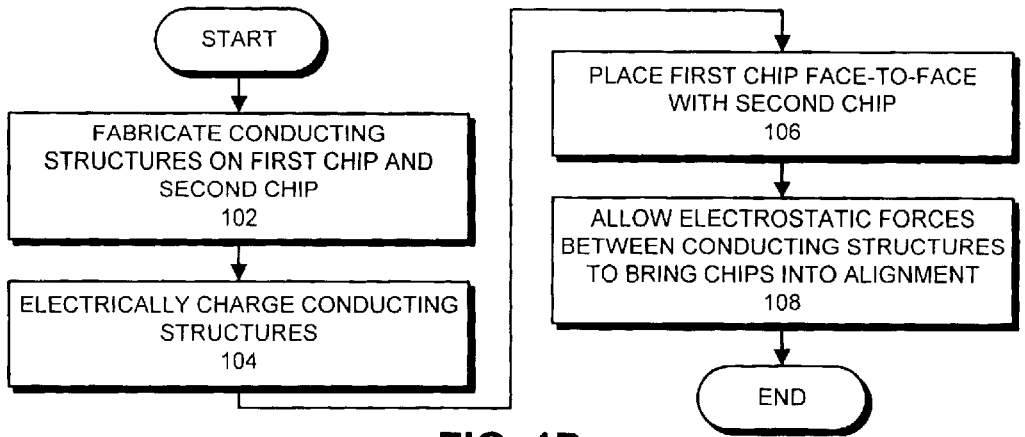
FIG. 1D

METHOD AND APPARATUS FOR ELECTROSTATICALLY ALIGNING INTEGRATED CIRCUITS

BACKGROUND

1. Field of the Invention

The present invention relates to techniques for assembling systems comprised of integrated circuits. More specifically, the present invention relates to a method and an apparatus that uses electrostatic forces to precisely align semiconductor chips relative to each other to facilitate system assembly.

2. Related Art

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem is beginning to create a bottleneck that continues to grow as semiconductor integration densities continue to increase.

Researchers have begun to investigate alternative techniques for communicating between semiconductor chips. One promising technique involves directly connecting two or more chips together face-to-face. In such an arrangement, hundreds or thousands of pads on the top-side of each chip come in contact or close proximity to matching pads on the other chip. Hence, the density of connections is very high and the distance the signals must travel is measured in microns instead of millimeters or centimeters.

In such a chip-to-chip scheme, there are several techniques by which electrical connections may be made between the pads. One technique is to provide solder balls on the pads of one chip. If the chips are placed face-to-face and nearly aligned, heating the solder balls makes electrical contact with the matching pads on the second chip and surface tension pulls the second chip into precise alignment.

Another technique is to communicate through capacitive coupling rather than through a direct connection. In this technique, each chip is manufactured with metal pads covered with an insulating layer of overglass about one micron thick. These chips are positioned face-to-face with the pads aligned. Capacitive coupling causes a voltage change on a transmitter pad to induce a voltage change on a corresponding receiver pad of the facing chip. This makes it possible to transmit signals directly between the chips without having to route the signal through intervening signal lines within a printed circuit board.

However, this technique requires precise alignment of chips without the benefit of surface tension pulling nearly aligned structures into precise alignment. Note that it is possible to align the facing chips precisely with micromanipulators, especially if electrical measurements of the quality of alignment can be made during the alignment process. However, use of such micromanipulators is time-consuming and expensive.

Hence, what is needed is a method and an apparatus for aligning semiconductor chips relative to each other without the problems listed above.

SUMMARY

One embodiment of the present invention provides a system that uses electrostatic forces to align semiconductor chips relative to each other. The system operates by fabricating a first set of conductors on the top surface of a first chip and fabricating a corresponding second set of conductors on the top surface of a second chip. To align the chips, the system electrically charges the first set of conductors and the second set of conductors. The system also places the first chip face-to-face with the second chip, so that the first set of conductors is in close proximity to the second set of conductors. This allows electrostatic forces between the first set of conductors and the second set of conductors to bring the first chip into alignment with the second chip and to hold them in place.

In a variation on this embodiment, the process of electrically charging the first set of conductors and the second set of conductors takes place after the first chip is placed face-to-face with the second chip.

In a variation on this embodiment, the process of electrically charging the first set of conductors and the second set of conductors involves applying a changing pattern of voltages to the first set of conductors and the second set of conductors.

In a variation on this embodiment, the system additionally vibrates the first chip and/or the second chip to facilitate aligning the first chip and the second chip.

In a variation on this embodiment, the system additionally applies a lubricant between the first chip and the second chip to reduce frictional forces between the first chip and the second chip during the alignment process.

In a variation on this embodiment, placing the first chip face-to-face with the second chip involves using a mold as a guide to facilitate bringing the first set of conductors in close proximity to the second set of conductors.

In a variation on this embodiment, a pattern formed by the first set of conductors matches a pattern formed by the second set of conductors.

In a variation on this embodiment, the first set of conductors and the second set of conductors are arranged in a checkerboard pattern.

In a variation on this embodiment, the first set of conductors and the second set of conductors are arranged in a pattern of concentric circles.

In a variation on this embodiment, the first set of conductors and the second set of conductors are arranged in a pattern with an autocorrelation approaching an impulse.

In a variation on this embodiment, the electrostatic forces between the first set of conductors and the second set of conductors include attractive forces and/or repulsive forces.

In a variation on this embodiment, the electrostatic forces between the first set of conductors and the second set of conductors generate a net repulsive force that levitates the first chip over the second chip, thereby reducing frictional forces between the first chip and the second chip.

In a variation on this embodiment, the first set of conductors comprises part of a power network and/or a ground network of the first chip.

In a variation on this embodiment, electrically charging the first set of conductors oil the first chip involves charging different conductors to different voltage levels.

In a variation on this embodiment, electrically charging the first set of conductors involves using electron-implanted charges.

In a variation on this embodiment, the system additionally bonds the first chip with the second chip after the first chip is brought into alignment with the second chip.

BRIEF DESCRIPTION OF THE FIGURES

FIG. 1A presents a top-view of chips including structures that facilitates electrostatic alignment in accordance with an embodiment of the present invention.

FIG. 1B presents a side-view of chips that are slightly misaligned in accordance with an embodiment of the present invention.

FIG. 1C presents a side-view of chips that are precisely aligned in accordance with an embodiment of the present invention.

FIG. 1D presents a flow chart illustrating the alignment process in accordance with an embodiment of the present invention.

DETAILED DESCRIPTION

Figure 2:
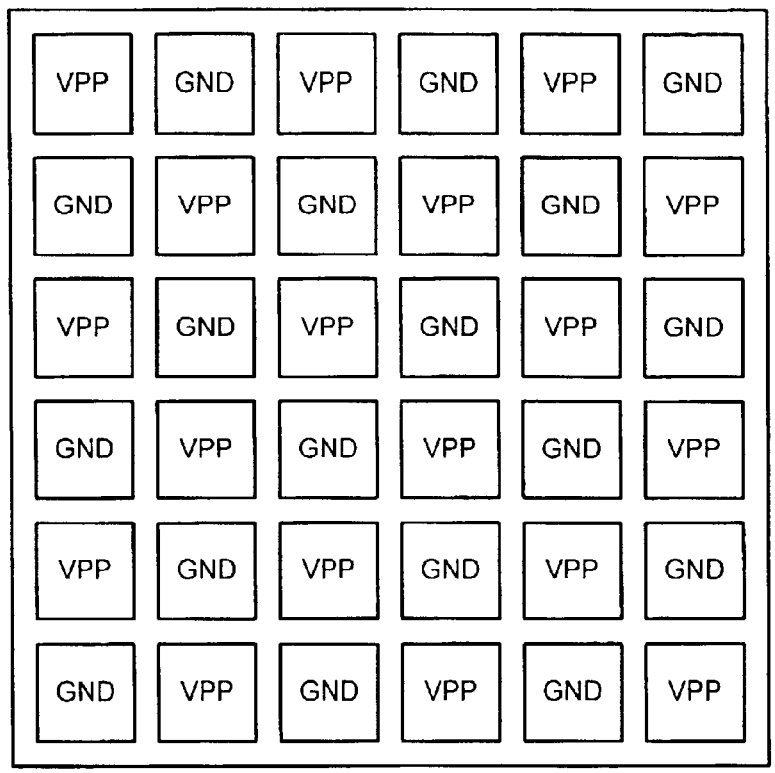
FIG. 2 illustrates a checkerboard pattern of conductors in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Conducting Structures

The present invention may be understood from the embodiments shown in FIG. 1A, which shows a top view of two chips before assembly. In FIG. 1A, we wish to flip chip B over and center it over chip A. Conducting structures are biased to either ground (GND) or a positive voltage (VPP) during assembly. The conductors may be formed within the top level of metal on each chip. When chip B is flipped over and placed on top of chip A, but not perfectly aligned, electrostatic attraction between the conducting structures Lends to pull the chips into precise alignment. In the side view illustrated in FIG. 1B, the chips are slightly misaligned. The electrostatic force tends to pull chip B to the left into better alignment. In the side view illustrated in FIG. 1C, the chips have been pulled into precise alignment by the electrostatic force between the conducting structures. Note that the vertical scales of FIGS. 1B and 1C arc exaggerated.

FIG. 1D presents a flow chart illustrating the alignment process in accordance with an embodiment of the present invention. The system starts by fabricating a set of conducting structures on the first chip and the second chip (step 102). Next, the system electrically charges the conducting structures (step 104) and places the first chip face-to-face with the second chip so that the conducting structures are in rough alignment (step 106). This allows electrostatic forces between the conducting structures to bring the chips into precise alignment (step 108).

Note that the conducting structures can be charged in a number of ways. (1) They can be brought into contact with charged probe tips. (2) They can be charged by circuitry within the chips—in which case step 106 can potentially take place before step 104. (3) Alternatively, they can be charged using electron-implanted charges.

Also note that these electrostatic forces can be attractive and/or repulsive forces. Moreover, the electrostatic forces can be increased by using elevated voltage levels (say ∀20 volts) to charge the conductors. However, if these elevated voltages are used, other circuitry on the chip may have to be insulated from the elevated voltages.

If the chips are successfully to be pulled into alignment, the force of electrostatic attraction should exceed the frictional forces opposing movement. The force of electrostatic attraction depends on the geometry of the conducting structures, the voltage applied, and the dielectric constant of the insulators between the conducting structures. A high voltage may be applied during assembly. The overglass should be thin (typically on the order of a micron) and a high dielectric constant is desirable. It may be smooth to minimize friction or may use bumps and divots to assist the fit. A lubricant may be provided between the chips to reduce the friction. A good lubricant should also have a high dielectric constant.

Vibration can be used for a number of purposes. By bouncing chip B up and down, static friction is repeatedly eliminated. In this case, the alignment forces tend to cause chip B to fall back closer to alignment after each bounce. Vibration can also be applied parallel to the chip surfaces. In this case, the vibration overcomes static friction forces and occasionally bring the chips close to alignment. The vibration amplitude can be gradually weakened, leaving the chips in alignment. At this point, the alignment forces tend to cause the chips to remain nearly aligned. Note the vibration can be ultrasonic, providing many cycles per second to speed the alignment process.

Static friction force can also be reduced by constructing the chips to have a net repulsive force. This can be accomplished by implanting like electrical charges, using ions, on both chips. A net repulsive force also occurs if the chips have equal voltages relative to ground potential.

After the chips are pulled into alignment, the chips can be bonded together using an adhesive or other bonding technique. In fact, an adhesive can possibly function as a lubricant if the adhesive has a long cure time, or can be selectively cured (for example, by applying UV light or heat).

Alignment Patterns

There are many possible geometries of conducting structures to provide alignment. FIG. 2 illustrates a checkerboard pattern. This two-dimensional pattern tends to draw the chips into alignment in both the x and y directions. Smaller squares lead to stronger attraction. However, the tolerance of the initial placement is proportional to the size of the square. Hence, if the chips are initially severely misaligned, they may be pulled into alignment with the wrong set of conductors.

Figure 3:
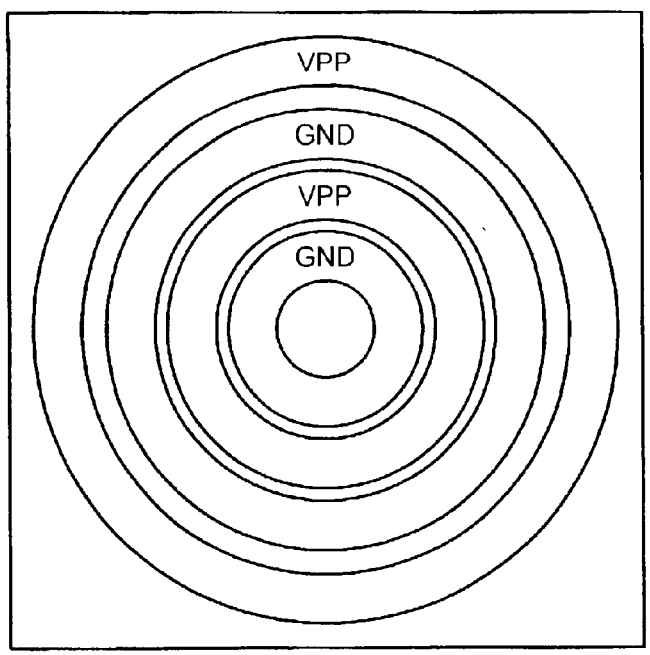
FIG. 3 illustrates conductors that form concentric circles in accordance with an embodiment of the present invention.

FIG. 3 shows a pattern of concentric circles. This geometry will not be drawn into alignment with the wrong set of conductors, but is susceptible to rotational misalignment.

Figure 4:
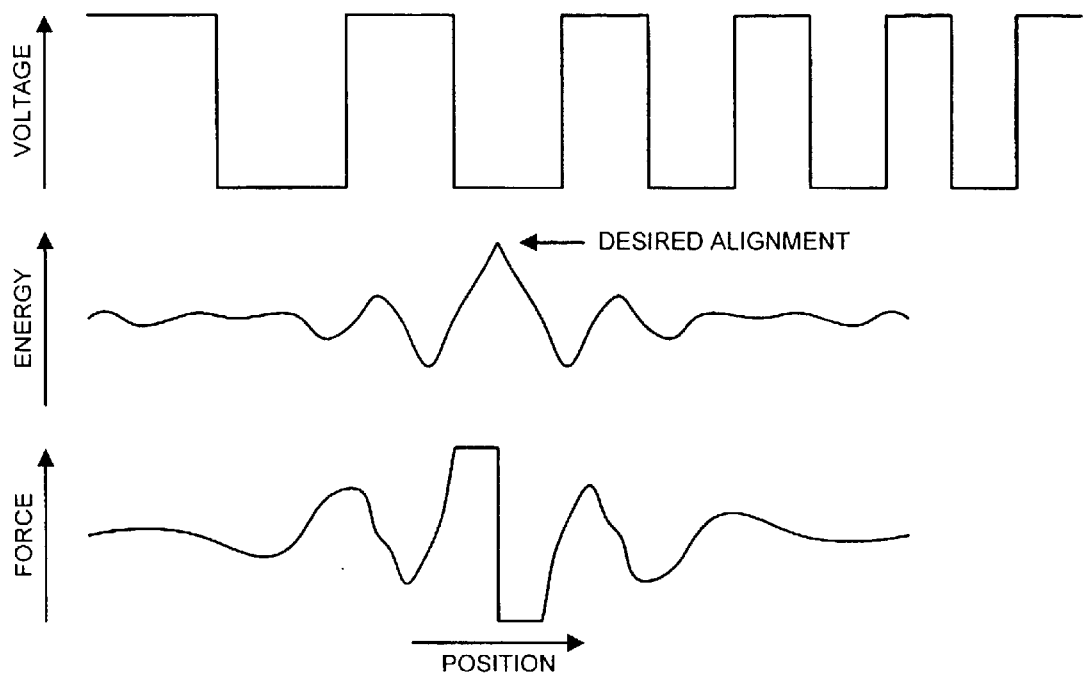
FIG. 4 illustrates how electrical energy and electrostatic forces vary as a function of alignment in accordance with an embodiment of the present invention.

Another implementation uses a pattern that has an autocorrelation approaching an impulse at perfect alignment. Two such patterns are chirps and pseudo-random bit sequences. When the conductors are misaligned, they attract and repel in approximately the same number of places, giving a net attraction of about zero. When they are perfectly aligned, they attract everywhere, giving a large attraction. The chips may he moved about manually or mechanically vibrated until they approach perfect alignment, at which point the attraction will become strong and the chips will snap into alignment and resist disturbance from alignment. For example, a one-dimensional chirp is shown in FIG. 4, which includes high and low-voltage conductors alternating with increasing spatial frequency across the chip. The energy stored between the conductors depends on the relative position of the chips and reaches a maximum at the point of desired alignment. Moreover, electrostatic attraction exerts a force proportional to the gradient of the electric field, leading to a strong force pulling the chips into alignment when they are near the desired point but a weak force elsewhere.

A chirp is a pattern of alternating GND and VPP conductors in which the frequency of alternation, i.e. the width of the conductors, increases linearly across the chip. A pseudo-random bit sequence is well-known in the literature and also has the property that the autocorrelation is an impulse. Both patterns may be formed in two dimensions to achieve alignment in both directions.

Figure 5:
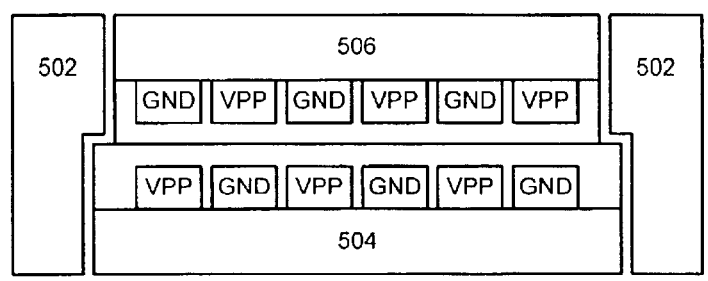
FIG. 5 illustrates how a mold can be used as a guide for an initial alignment in accordance with an embodiment of the present invention.

The accuracy of the initial placement may be improved through mechanical techniques. In one embodiment of the present invention, a mold is used to align the chips approximately during initial placement. FIG. 5 shows a side view of a laser-cut plastic mold 502 used for alignment. The mold 502 fits around the edge of the lower chip 504. The upper chip 506 is placed in the hole in the upper portion of the mold 502 and thus is aligned to within the tolerances of the mold 502, for example, about 0.001 inches.

Note that the upper-level conductors on a chip are a limited resource. Hence, the conductors for alignment can double as metal power and ground lines on the chip to use the resource more effectively.

Changing Patterns

Figure 6:
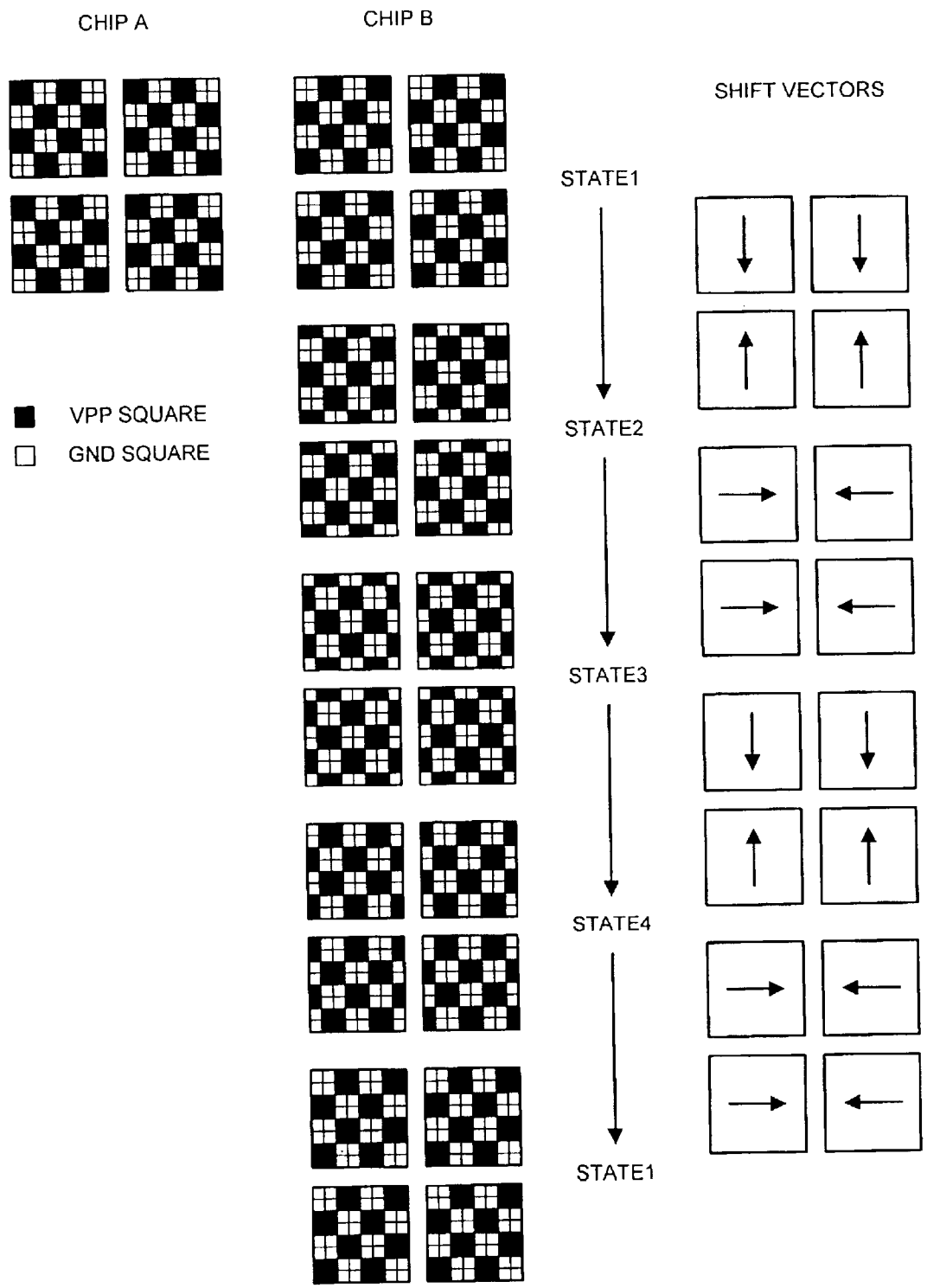
FIG. 6 illustrates a time-dependent voltage pattern that pulls chips into alignment in accordance with an embodiment of the present invention.

Another technique for pulling the chips into alignment is shown in FIG. 6. In this technique, the pattern of VPP and GND assignments to conductors on one or both chips is changed as a function of time so that the chips move into lock. FIG. 6 shows one possible set of patterns versus time. In this assignment, chip A has a static checkerboard pattern broken into four quadrants, whereas chip B has a pattern that cycles through four states. The pattern on chip B is also broken up into four quadrants. In the first state, chips A and B are susceptible to snapping to an incorrect alignment. However, by varying the voltages, each quadrant shifts the assignment of VPP and GND towards the center of chip B. If chip A is not properly aligned over chip B, then the changing patterns pulls them into alignment. Once aligned, the forces due to the quadrant shifts cancel one another. At this point, the pattern on chip B can be held in State 1 to conserve power.

Figure 7:
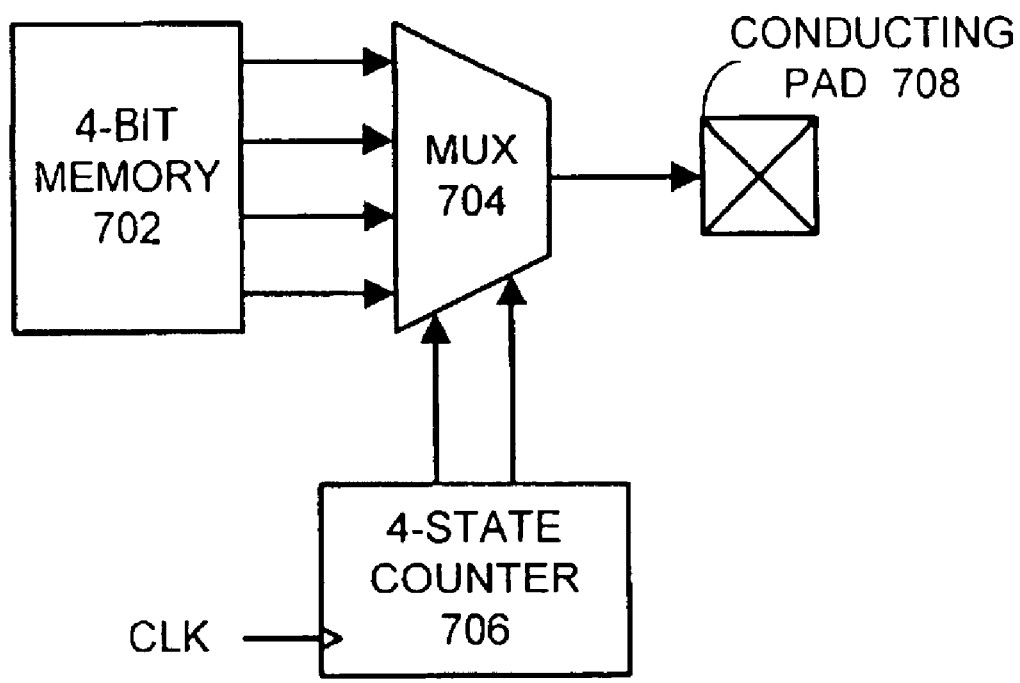
FIG. 7 illustrates circuitry for switching voltages onto a conducting pad in accordance with an embodiment of the present invention.

FIG. 7 illustrates circuitry that changes a pattern of voltages that is driven onto a conducting pad in accordance with an embodiment of the present invention. In FIG. 7, a 4-bit pattern contained in a 4-bit memory 702 is progressively driven onto a conducting pad 708 by using a 4-state counter 706 to generate a changing pattern of select inputs for multiplexer (MUX) 704.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that facilitates using electrostatic forces to align semiconductor chips relative to each other, comprising:

a charging mechanism configured to electrically charge a first set of conductors on a first chip and a second set of conductors on a second chip; and an initial placement mechanism configured to place the first chip face-to-face with the second chip, so that the first set of conductors is in close proximity to the second set of conductors;

whereby electrostatic forces between the first set of conductors and the second set of conductors bring the first chip into alignment with the second chip.

2. The apparatus of claim 1, wherein the charging mechanism operates after the first chip is placed face-to-face with the second chip.

3. The apparatus of claim 1, wherein the charging mechanism applies a changing pattern of voltages to the first set of conductors and the second set of conductors.

4. The apparatus of claim 1, further comprising a vibrating mechanism configured to vibrate the first chip and/or the second chip to facilitate aligning the first chip and the second chip.

5. The apparatus of claim 1, further comprising a lubricating mechanism configured to apply a lubricant between the first chip and the second chip to reduce frictional forces between the first chip and the second chip during the alignment process.

6. The apparatus of claim 1, wherein the initial placement mechanism is configured to use a mold as a guide to facilitate bringing the first set of conductors in close proximity to the second set of conductors.

7. The apparatus of claim 1, wherein a pattern formed by the first set of conductors matches a pattern formed by the second set of conductors.

8. The apparatus of claim 1, wherein the first set of conductors and the second set of conductors are arranged in a checkerboard pattern.

9. The apparatus of claim 1, wherein the first set of conductors and the second set of conductors are arranged in a pattern of concentric circles.

10. The apparatus of claim 1, wherein the first set of conductors and the second set of conductors are arranged in a pattern with an autocorrelation approaching an impulse.

11. The apparatus of claim 1, wherein the electrostatic forces between the first set of conductors and the second set of conductors include attractive forces and/or repulsive forces.

12. The apparatus of claim 11, wherein the electrostatic forces between the first set of conductors and the second set of conductors generate a net repulsive force that levitates the first chip over the second chip, thereby reducing frictional forces between the first chip and the second chip.

13. The apparatus of claim 1, wherein the first set of conductors comprises part of a power network and/or a ground network of the first chip.

14. The apparatus of claim 1, wherein the charging mechanism is configured to charge different conductors to different voltage levels.

15. The apparatus of claim 1, wherein the charging mechanism is configured to use electron-implanted charges.

16. The apparatus of claim 1, further comprising a bonding mechanism that is configured to bond the first chip with the second chip after the first chip is brought into alignment with the second chip.

17. A means for using electrostatic forces to align semiconductor chips relative to each other, comprising:

a charging means for electrically charging a first set of conductors on a first chip and a second set of conductors on a second chip; and an initial placement means for placing the first chip face-to-face with the second chip, so that the first set of conductors is in close proximity to the second set of conductors;

whereby electrostatic forces between the first set of conductors and the second set of conductors bring the first chip into alignment with the second chip.

* * * * *